(12) United States Patent
Chang et al.

(10) Patent No.: US 6,870,413 B1
(45) Date of Patent: Mar. 22, 2005

(54) SCHMITT TRIGGER CIRCUIT WITH ADJUSTABLE TRIP POINT VOLTAGES

(75) Inventors: Tzung-Chin Chang, San Jose, CA (US); Chiakang Sung, Milpitas, CA (US); Khai Nguyen, San Jose, CA (US); Joseph Huang, San Jose, CA (US); Bonnie Wang, Cupertino, CA (US); Yan Chong, Stanford, CA (US); Xiaobao Wang, Santa Clara, CA (US); Philip Pan, Fremont, CA (US); Gopinath Rangan, Santa Clara, CA (US); In Whan Kim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/017,933

(22) Filed: Dec. 14, 2001

(51) Int. Cl.[7] .............................................. H03K 3/012
(52) U.S. Cl. ...................................... 327/205; 327/206
(58) Field of Search ................................. 327/205, 206

(56) References Cited

U.S. PATENT DOCUMENTS

| | | | | |
|---|---|---|---|---|
| 4,859,873 A | * | 8/1989 | O'Shaughnessy et al. | 327/74 |
| 5,248,907 A | | 9/1993 | Lin et al. | 326/33 |
| 5,336,942 A | * | 8/1994 | Khayat | 327/206 |
| 5,874,844 A | * | 2/1999 | Shin | 327/206 |
| 6,163,166 A | | 12/2000 | Bielby et al. | 326/38 |

OTHER PUBLICATIONS

Kuang, J.B., et al., "PD/SOI CMOS Schmitt Trigger Circuits with Controllable Hysteresis," IBM Corporation, (Apr. 2001).
"CD4016BM/CD40106BC Hex Schmitt Triger," National Semiconductor, (Feb. 1988).
"CMOS Schmitt Trigger—A Uniquely Versatile Design Component," Fairchild Semiconductor Application Note 140 (Jun. 1975).

* cited by examiner

Primary Examiner—Kenneth B. Wells
(74) Attorney, Agent, or Firm—Morgan, Lewis & Bockius LLP

(57) ABSTRACT

A Schmitt trigger circuit has an adjustable hysteresis characteristic by providing a plurality of feedback circuits that differently affect at least one, and preferably both, of the circuit's upper trip point level and lower trip point level. The upper trip point level can be adjusted by selecting a desired feedback circuit from a first set of feedback circuits, and/or the lower trip point level can be adjusted by selecting a desired feedback circuit from a second set of feedback circuits. Feedback circuit selection is achieved by one or more control signals that may be programmable. The hysteresis characteristic can be adjusted to meet desired noise margin, delay, and input recognition criteria at different VCC levels. The Schmitt trigger circuit may be a CMOS Schmitt trigger with two input stage NMOS, two input stage PMOS transistors, a first set of NMOS feedback circuits, and a second set of PMOS feedback circuits.

25 Claims, 3 Drawing Sheets

SCHMITT TRIGGER CIRCUIT WITH ADJUSTABLE TRIP POINT VOLTAGES

FIELD OF INVENTION

The present invention relates generally to the fields of digital circuits and electronics. More particularly, it relates to a Schmitt trigger circuit that has adjustable trip point voltages and that is suitable for use with different power supply signal levels.

BACKGROUND OF THE INVENTION

In a digital system, signals typically take on one of two values, i.e., high or low, depending on the voltage level of the signal. Ideally, digital signals do not depart significantly from their expected voltage levels, but in practice digital systems usually operate under noisy conditions where there are signals unrelated to the signal of interest. In some cases, the noise level can be so large that false switching occurs, resulting in a meta-stable environment in which a digital low signal appears as a digital high signal, or vice-versa.

A common approach to eliminating or reducing the effects of noise in a digital system is to employ logic circuitry in which the output voltage as a function of input voltage, i.e., the voltage transfer characteristic (VTC), uses a hysteresis detection scheme instead of a single (or fixed) trip point detection scheme. In a VTC with hysteresis, there are two different logic trip points at which the output changes state: an upper trip point ($V_{T+}$) for low level input signals that are rising, and a lower trip point ($V_{T-}$) for high level input signals that are falling. In between the logic trip points, a deadband region exists. The width of the deadband region in the VTC is referred to as the hysteresis voltage and equals $V_{T+} - V_{T-}$.

In digital technology, an input detected using hysteresis is generally referred to as a Schmitt-triggered input, and a circuit which uses such detection as a Schmitt trigger circuit. Schmitt trigger circuits typically use regenerative, i.e., positive, feedback to convert a noisy or slow-changing input signal into a clean, sharply changing digital output signal. Schmitt triggers are commonly employed in various types of logic circuits, simple examples of which are inverting and non-inverting buffers. Due to the hysteresis characteristic of a Schmitt trigger circuit, once the input crosses a trip point and causes the output state to change, any noise in the input will not affect the output logic state as long as noise pulses are smaller than the hysteresis voltage. In contrast, in a single (i.e., fixed) trip point circuit, the output may undesirably switch states several times when the input is near the trip point level, even in the presence of only small noise pulses. A Schmitt trigger's hysteresis voltage, $V_{T+} - V_{T-}$, thus provides a noise margin indicative of the amount of noise that can be tolerated without registering false output states. It is generally desirable for the noise margin to be large. However, if the upper trip point voltage is set too high and/or the lower trip point voltage is set too low, actual input voltage transitions may be unduly delayed at the output or, worse yet, not recognized at all.

The hysteresis voltage (i.e., noise margin) and the specific trip point voltages $V_{T+}$ and $V_{T-}$ of a Schmitt trigger circuit are dependent on the power supply voltage VCC driving the circuit. For a given VCC level, a Schmitt trigger circuit can be designed to provide a desired hysteresis voltage and trip point voltages. However, in many digital circuits such as programmable logic devices, the VCC level may vary considerably depending on the application. For instance, Schmitt trigger circuits are commonly used in input/output (I/O) circuit applications where a VCC_IO supply may vary from 1.5 V to 5.0 V depending on the logic family and I/O standard being used. If a Schmitt trigger circuit is designed to operate for a given VCC voltage, when the value of VCC changes by a significant amount, the hysteresis voltage and specific trip point voltage levels may no longer satisfy desired noise margin, delay, and input recognition criteria. Consequently, there is a need for a Schmitt trigger circuit that can meet desired hysteresis criteria at more than one VCC voltage level.

SUMMARY OF THE INVENTION

The present invention provides a Schmitt trigger circuit with an adjustable hysteresis characteristic by providing a plurality of control circuits that differently affect at least one, and preferably both, of the circuit's upper trip point level and lower trip point level. The upper trip point level can be adjusted by selecting a desired control circuit from a first set of control circuits, and the lower trip point level can be adjusted by selecting a desired control circuit from a second set of control circuits. In this manner, the hysteresis characteristic can be adjusted to meet desired noise margin, delay, and input recognition criteria at different VCC levels.

The invention provides a Schmitt trigger circuit having a first transistor coupled between a reference node and a first node, a second transistor coupled between the first node and a second node, a third transistor coupled between the second node and a third node, and a fourth transistor coupled between the third node and a power supply signal node. Each of the first, second, third, and fourth transistors has a control (e.g., gate) terminal for receiving an input signal. A first plurality of control circuits selectively provides a first control path between the second node and the first node. Each of those control circuits receives a control signal so that only one of the first plurality of control circuits provides the first control path at any one time. Similarly, a second plurality of control circuits selectively provides a control path between the second node and the third node. Each of these control circuits also receives a control signal so that, again, only one of the second plurality of control circuits provides the second control path at any one time.

Each control circuit in the first plurality of control circuits may have a first control transistor and a second control transistor. The first control transistor has a control terminal coupled to the second node and is coupled between the power supply signal node and the second control transistor. The second control transistor has a control terminal for receiving the control signal provided to the corresponding control circuit, with the second control transistor being coupled between the first control transistor and the first node.

Similarly, each control circuit in the second plurality of control circuits may have a first control transistor and a second control transistor. The first control transistor has a control terminal coupled to the second node and is coupled between the reference node and the second control transistor. The second control transistor has a control terminal for receiving the control signal provided to the corresponding control circuit, and the second control transistor is coupled between the first control transistor and the third node.

In one embodiment, the first transistor, the second transistor, and the control transistors in each control circuit in the first plurality of control circuits are n-channel metal oxide semiconductor field-effect transistors, and the third transistor, the fourth transistor, and the control transistors in each control circuit in the second plurality of control circuits are p-channel metal oxide semiconductor field-effect transistors.

By, for example, varying the combined conductivity of the control transistors in the control circuits and/or varying the threshold voltages of the first feedback control transistor in the control circuits, the control circuits can be designed to provide different upper and/or lower trip point levels.

BRIEF DESCRIPTION OF THE DRAWINGS

The objects and advantages of the present invention will be better understood and more readily apparent when considered in conjunction with the following detailed description and accompanying drawings which illustrate, by way of example, preferred embodiments of the invention and in which.

DETAILED DESCRIPTION OF PREFERRED EMBODIMENTS

Figure 1:
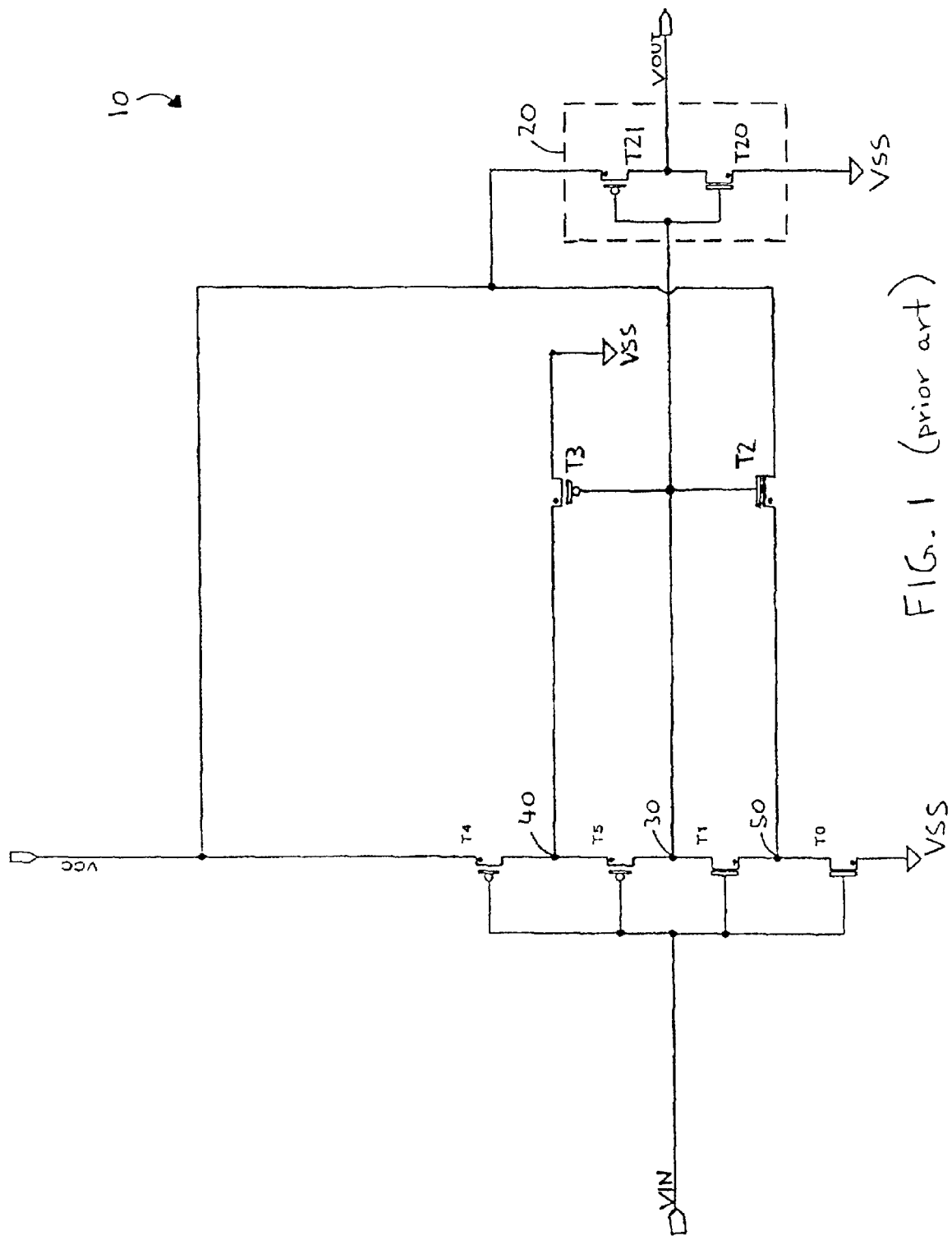
FIG. 1 is a circuit diagram of a prior art CMOS Schmitt trigger circuit.

FIG. 1 is a circuit diagram of a prior art Schmitt trigger circuit 10 implemented using CMOS (complementary metal-oxide semiconductor) technology in which n-channel (NMOS) and p-channel (PMOS) metal oxide semiconductor field-effect transistors are combined, typically on a common substrate. CMOS-based implementations of Schmitt triggers are generally advantageous since they provide a high input impedance, can be readily designed to have threshold voltages that are roughly symmetrical to one-half the supply voltage, consume low power, and are easily integrated with other CMOS circuitry. CMOS Schmitt Triggers are discussed, for example, in "CMOS Schmitt Trigger B A Uniquely Versatile Design Component", *Fairchild Semiconductor Application Note* 140 (June 1975) and in Kuang et al., "PD/SOI CMOS Schmitt Trigger Circuits with Controllable Hysteresis", *International Symposium on VLSI Technology, Systems, and Applications*, Hsinchu, Taiwan (April 2001), and the contents of each are incorporated herein by virtue of this reference.

Referring to FIG. 1, Schmitt trigger circuit 10 includes four NMOS transistors T0, T1, T2, and T20 and four PMOS transistors T3, T4, T5, and T21. Transistors T0, T1, T4, and T5 provide an first inversion stage, transistors T2 and T3 are control transistors, and transistors T20 and T21 form a second inversion stage 20. As will be appreciated by those of ordinary skill in the art, Schmitt trigger circuit 10 may form part of a buffer circuit, inverter circuit, or any other type of logic circuit. In particular, Schmitt trigger circuit 10 may be used in input/output circuit applications to improve signal transitions and enhance noise immunity.

As shown in FIG. 1, an input signal VIN is applied to the gate (i.e., control) terminals of each of transistors T0, T1, T4, and T5. The source terminal of NMOS transistor T0 is connected to the most negative supply reference VSS (which is typically ground, i.e., 0 V), and the drain terminal of transistor T0 is connected to the source terminal of NMOS transistor T1 at a node 50. The source terminal of PMOS transistor T4 is connected to a positive power supply signal VCC, and the drain terminal of transistor T4 is connected to the source terminal of PMOS transistor T5 at a node 40. The drain terminals of transistors T1 and T5 are connected together at a node 30. NMOS transistor T2 provides a control path from node 30 to node 50. The gate terminal of transistor T2 is connected to node 30, its drain terminal is connected to VCC, and its source terminal is connected to node 50. Similarly, PMOS transistor T3 provides a control path from node 30 to node 40. The gate terminal of transistor T3 is connected to node 30, while the drain terminal of transistor T3 is connected to VSS and its source terminal is connected to node 40. As will be appreciated by those skilled in the art, because of the symmetry of standard MOS transistors, the designation of source and drain in transistors T2 and T3 is not critical, but rather is used for ease of description.

Node 30 is also connected to the input of inverter stage 20 which comprises an NMOS transistor T20 having its source coupled to VSS and a PMOS transistor T21 with its source coupled to VCC. The gates of transistors T20 and T21 receive the signal at node 30, and the drains of transistors T20 and T21 are connected together to provide a node for the Schmitt trigger output signal VOUT.

Where a CMOS IC device is implemented on a p-type substrate, a PMOS transistor is typically formed within an n-well, i.e., a well of n-type material, in the p-type substrate. Similarly, if an IC device is fabricated on an n-type substrate, an NMOS transistor is formed within a p-type doped well in the n-type substrate. In addition, the body of a MOS transistor, effectively the channel or substrate of the transistor, is usually connected to VCC or VSS. More specifically, the p-type body of an NMOS transistor is usually connected to the most negative supply in the device (i.e., VSS), while the n-type body of a PMOS transistor is usually connected to the most positive voltage in the device (i.e., VCC). Thus, though not specifically indicated in FIG. 1, the body terminals of NMOS transistors T0, T1, T2, and T20 are connected to VSS and the body terminals of PMOS transistors T3, T4, T5, and T21 are connected to VCC.

The threshold voltage Vth of a MOSFET transistor is generally the lowest gate-to-source (or source-to-gate) voltage that causes a substantial current to flow through the transistor. The threshold voltage is positive for an NMOS transistor (Vthn) and negative for a PMOS transistor (−Vthp). In effect, the transistor turns on when Vgs>Vthn for an NMOS transistor and Vsg>Vthp for a PMOS transistor, where Vgs is the gate-to-source voltage and Vsg is the source-to-gate voltage. The threshold voltage of a transistor varies depending on a number of factors including the semiconductor manufacturing process used and operating temperature. In addition, the body biasing effect, an effect in integrated circuits that depends in part on the voltage between the source and body of the transistor when the two are not tied together, may also increase the effective threshold for turning on a MOS transistor beyond the design-specified Vth parameter. Typical threshold voltages for the transistors in FIG. 1 may be in the range of 0.3 to 1.0 V. Commonly, NMOS transistors T0, T1, and T2 are designed to have the same intrinsic threshold voltage Vthn (i.e., ignoring the body bias effect), and similarly PMOS transistors T3, T4, and T5 are designed to have the same threshold voltage Vthp. However, it will be appreciated that the threshold voltages of these transistors may also be designed to differ.

The operation of Schmitt trigger circuit 10 will now be described. Generally, transistors T0, T1, T4, and T5 effectively act as a CMOS inverter by providing an inverted VIN signal at node 30. The second inverter stage 20 thus renders the overall Schmitt trigger circuit 10 non-inverting, since VIN=VOUT during steady state operation. Alternatively, inverter stage 20 may be omitted, in which case trigger circuit 10 provides an inverted output signal. Schmitt trigger circuit 10 may also include additional circuitry (not shown) such as latch or flip-flop circuitry for better holding the steady state level of VOUT.

When the VIN signal to trigger circuit 10 is low (i.e., at or near VSS), transistors T0 and T1 are off while transistors T4 and T5 turn on. As a result, the voltage at node 30 is pulled high, approximately to VCC. Since the gates of control transistors T2 and T3 are high, PMOS transistor T3 is off while NMOS transistor T2 turns on. As will be appreciated by those skilled in the art, transistor T2 acts as a source follower when on since the drain of T2 is tied to the DC supply, VCC. As a result, the voltage at the source of transistor T2 (i.e., node 50) follows the voltage at its gate (i.e., node 30) minus a voltage drop that is approximately equal to the threshold voltage Vthn of transistor T2. As VIN rises at the onset of a low to high transition, the voltage at the gate of NMOS transistor T0 eventually increases above Vthn, turning transistor T0 on. However, since the source terminal of NMOS transistor T1 is higher than the body of transistor T1, the body biasing effect raises the effective threshold of transistor T1, and therefore transistor T1 remains off when transistor T0 initially turns on. Since transistors T2 and T0 are both on, they effectively form a voltage divider between node 30 and VSS at node 50. If transistors T2 and T0 are matched in terms of their conductivity parameters, the voltage at node 50 is roughly half the voltage at node 30, i.e., ½ VCC.

As VIN continues to rise and increases to one threshold voltage Vthn above the voltage at node 50 (i.e., ½ VCC+Vthn, if T2 and T0 are matched), NMOS transistor T1 turns on, and the voltage at node 30 is pulled low toward VSS. This starts a low to high transition in VOUT. As the voltage at node 30 falls, the source-following behavior of transistor T2 now acts to pull node 50 low and the influence of the voltage divider rapidly disappears, further lowering node 30. As the voltage at node 30 decreases, PMOS transistor T3 begins to turn on. Since transistor T3 also acts a source follower, the voltage at node 40 is also pulled low following the voltage at node 30. As a result, since the voltage at the source terminal of PMOS transistor T5 is low, transistor T5 turns off and node 30 is rapidly tied to VSS. As VIN continues to rise, PMOS transistor T4 also turns off. The voltage at node 30 is therefore held at a low level and, consequently, the output voltage VOUT is high.

With VIN high, the voltage at node 40 is approximately Vthp due to the source follower behavior of the conducting PMOS control transistor T3. When VIN begins falling from its high level at the onset of a high to low transition, Schmitt trigger circuit 10 operates in a similar manner to that described above. In particular, when VIN falls more than one Vthn below VCC, PMOS transistor T4 turns on. PMOS transistor T5 remains off at this stage, since the body biasing effect increases the effective turn-on threshold of transistor T5. With transistor T3 and T4 both on, a voltage divider is effectively formed at node 40, dividing the voltage between VCC and node 30. If transistors T3 and T4 are matched in terms of their conductivity parameters, the voltage at node 40 will be roughly ½ VCC. As VIN continues to fall and decreases to a threshold voltage Vthp below the voltage at node 40 (i.e., ½ VCC−Vthp), PMOS transistor T5 turns on, and the voltage at node 30 is pulled high toward VCC. At this point, a high-to-low transition in VOUT begins. With the voltage at node 30 rising, the source-following behavior of transistor T3 further acts to pull node 40 high, effectively ending the influence of the voltage divider formed by T3 and T4. As the voltage at node 30 continues to rise, NMOS control transistor T2 begins to turn on, and the voltage at node 50 is also pulled high due to the effect of control transistor T2. As a result, NMOS transistor T1 shuts off and the voltage at node 30 is rapidly brought to VCC. Further increases in VIN act to shut off NMOS transistor T0, and circuit 10 subsequently stabilizes with node 30 held high and VOUT held low.

Figure 2:
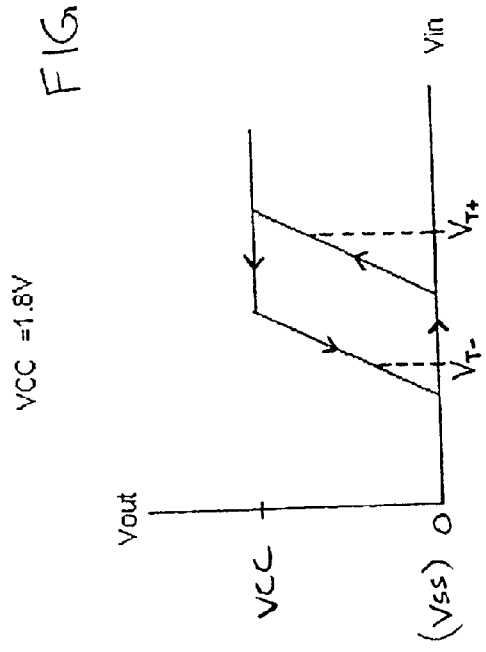
FIG. 2 is a plot of the voltage transfer characteristic of the circuit of FIG. 1 at a first power supply signal level.

FIG. 2 illustrates the hysteresis effect provided by Schmitt trigger circuit 10. As shown, the VTC of circuit 10 has two different logic trip points: an upper trip point $V_{T+}$ at which a rising VIN signal triggers a high level VOUT signal, and a lower trip point $V_{T-}$ at which a falling VIN signal triggers a low level VOUT signal. The specific voltage values at which a high and low output states are recognized may vary. For example, it is common in CMOS circuits for a high output state to be recognized when VOUT>0.7 VCC and a low output state to be recognized when VOUT<0.3 VCC, in which case VOUT=0.7 VCC at $V_{T+}$ and VOUT=0.3 VCC at $V_{T-}$.

In view of the operation of Schmitt trigger circuit 10 described above, it will be appreciated that VIN reaches the upper trip point $V_{T+}$ approximately when NMOS transistor T1 turns on. Where the conductivity of transistors T2 and T0 is matched, this occurs when VIN=$V_{T+}$≈½ VCC+Vthn. Similarly, VIN reaches the lower trip point $V_{T-}$ approximately when PMOS transistor T5 first turns on. This occurs at about VIN=$V_{T-}$≈½ VCC−Vthp if the conductivity of transistors T3 and T4 is matched. Thus, by increasing the threshold voltage of NMOS transistor T1, $V_{T+}$ can be increased, and by increasing the magnitude of the threshold voltage of PMOS transistor T5, $V_{T-}$ can be decreased. Lowering these threshold voltages has the opposite effect.

However, the upper and lower trip point voltages of circuit 10 can also be varied by adjusting the device parameters of control transistors T2 and T3 respectively. In particular, by increasing (or decreasing) the conductivity of NMOS transistor T2 relative to transistor T0, the upper trip point $V_{T+}$ also increases (or decreases). Similarly, by increasing (or decreasing) the conductivity of PMOS transistor T3 relative to transistor T4, the lower trip point $V_{T-}$ decreases (or increases). The conductivity of a MOSFET transistor may be raised by increasing the width-to-length ratio of the transistor's gate (i.e., its channel) and lowered by reducing that ratio. (Note the length of the gate is generally the distance between the source and the drain of the transistor.) Moreover, if the threshold voltage of control transistor T2 is designed independently of transistors T0 and T1 and if threshold voltage of control transistor T3 is designed independently of transistors T4 and T5, the control transistor threshold voltages may also be adjusted to vary $V_{T+}$ and $V_{T-}$. In this case, lowering the magnitude of the threshold voltage for transistor T2 generally serves to raise the upper trip point $V_{T+}$, and lowering the magnitude of the threshold voltage for transistor T3 generally serves to bring down the lower trip point $V_{T-}$.

Figure 3:
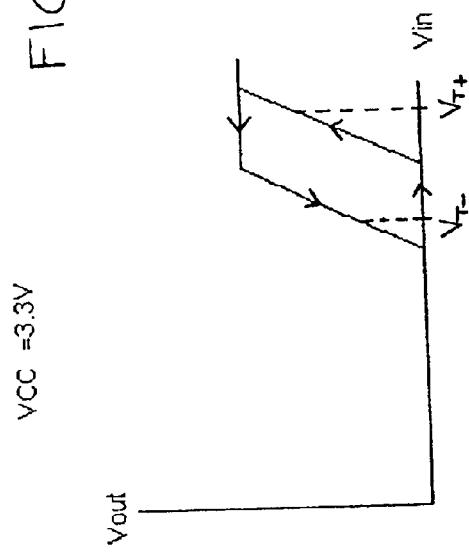
FIG. 3 is a plot of the voltage transfer characteristic of the circuit of FIG. 1 at a second power supply signal level.

For a given value of VCC, e.g., VCC=1.8 V as indicated in FIG. 2, Schmitt trigger circuit 10 can thus be designed to provide a desired upper trip point voltage $V_{T+}$ and lower trip point voltage $V_{T-}$. However, if VCC is changed, e.g., to VCC=3.3. V as shown in the VTC of FIG. 3, the trip point voltages also change. (Note that FIGS. 2 and 3 are not drawn to scale.) When VCC changes, particularly by a large amount, the new trip point voltage levels may not satisfy desired noise margin criteria and/or they may lead to unwanted delay or even a failure to recognize legitimate input signal transitions.

Figure 4:
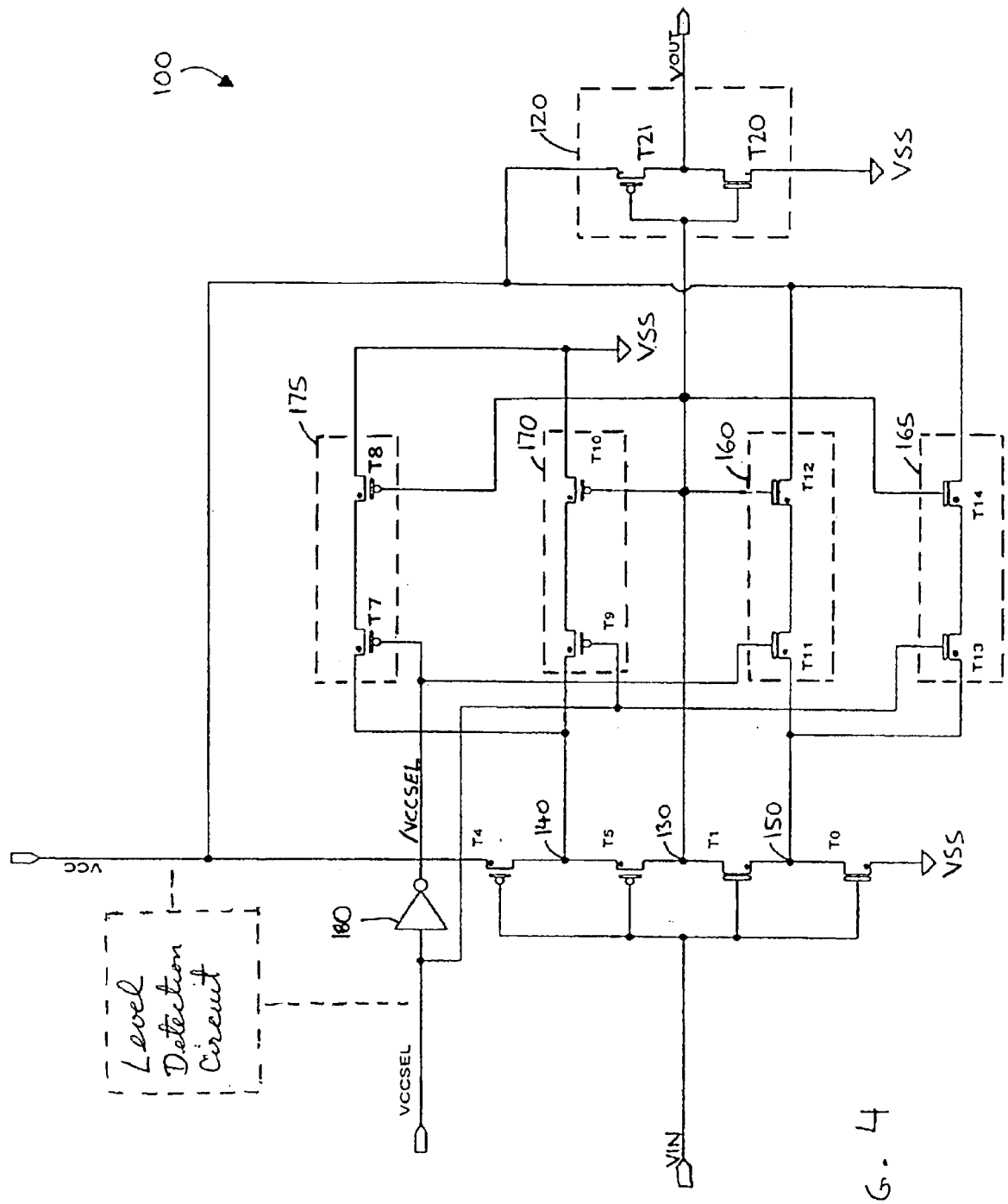
FIG. 4 is a circuit diagram of a CMOS Schmitt trigger circuit having a plurality of selectable control circuits in accordance with an embodiment of the present invention.

This problem is overcome by Schmitt trigger circuit 100 in FIG. 4, which illustrates an embodiment of the present invention. Similar to circuit 10 in FIG. 1, Schmitt trigger circuit 100 includes an initial signal inversion stage that includes NMOS transistors T0 and T1 and PMOS transistors T4 and T5. However, in place of the fixed control transistors T2 and T3 of the circuit of FIG. 1, circuit 100 includes two switchable NMOS transistor control circuits 160 and 165 and two switchable PMOS transistor control circuits 170 and 175. Switchable control circuits 160, 165, 170, and 175 are controlled, or selected, by a VCCSEL signal. As shown, trigger circuit 100 may also include a subsequent output inverter stage 120 to render circuit 100 non-inverting. Inverter stage 120 includes NMOS transistor T20 and PMOS transistor T21, similar to stage 20 in circuit 10.

Referring to FIG. 4, input signal VIN is applied to the gate terminals of each of transistors T0, T1, T4, and T5. The source terminal of NMOS transistor T0 is connected to the most negative supply reference VSS (typically 0 V), and the drain terminal of transistor T0 is connected to the source terminal of NMOS transistor T1 at a node 150. The source terminal of PMOS transistor T4 is connected to a positive power supply signal VCC, and the drain terminal of transistor T4 is connected to the source terminal of PMOS transistor T5 at a node 140. The drain terminals of transistors T1 and T5 are connected together at a node 130.

NMOS transistor control circuit 160 comprises two NMOS transistors T11 and T12. The gate terminal of transistor T12 is connected to node 130, its drain terminal is connected to VCC, and its source terminal is connected to the drain terminal of transistor T11. The source terminal of transistor T11 is connected to node 150, while the gate terminal of transistor T11 receives an inverted version /VCCSEL of control signal VCCSEL via an inverter 180. In a similar manner, NMOS transistor control circuit 165 also comprises two NMOS transistors T13 and T14. The gate terminal of transistor T14 is connected to node 130, its drain terminal is connected to VCC, and its source terminal is connected to the drain terminal of transistor T13. The source terminal of transistor T13 is connected to node 150, and the gate terminal of transistor T13 receives control signal VCCSEL. Although not specifically indicated in FIG. 4, the body terminals of the NMOS transistors in circuit 100 are connected to VSS and the body terminals of the PMOS transistors in circuit 100 are connected to VCC (similar to circuit 10).

PMOS transistor control circuit 170 comprises two PMOS transistors T9 and T10. The gate terminal of transistor T10 is connected to node 130, its drain terminal is connected to VSS, and its source terminal is connected to the drain terminal of transistor T9. The source terminal of transistor T9 is connected to node 140, and the gate terminal of transistor T9 receives control signal VCCSEL. Similarly, PMOS transistor control circuit 175 comprises two PMOS transistors T7 and T8. The gate terminal of transistor T8 is connected to node 130, its drain terminal is connected to VSS, and its source terminal is connected to the drain terminal of transistor T7. The source terminal of transistor T7 is connected to node 140, and the gate terminal of transistor T7 receives inverted control signal /VCCSEL.

When VCCSEL is low, the gate of PMOS transistor T9 is low and the gate of NMOS transistor T11 is high, while the gate of PMOS transistor T7 is high and the gate of NMOS transistor T13 is low. Thus, transistors T9 and T11 are on, while transistors T7 and T13 are off. As a result, when Schmitt trigger circuit 100 operates with VCCSEL low, control circuits 160 and 170 are selected as the respective NMOS and PMOS control paths from node 130 to nodes 150 and 140 respectively. On the other hand, when circuit operates in a high VCCSEL mode, control circuits 165 and 175 are selected as the respective NMOS and PMOS control paths from node 130. Unlike circuit 10, which had only one control transistor in each path, in Schmitt trigger circuit 100 it will be appreciated that the cumulative effect of the transistors in a given control circuit generally affects the hysteresis characteristic.

By using transistors with different conductivity parameters in NMOS control circuits 160 and 165, the overall conductivity of those control circuits can be made to differ. For example, if transistors T11 and T12 together provide a greater conductivity than transistors T13 and T14, Schmitt trigger circuit 100 will have a higher upper trip point $V_{T+}$ (for a given VCC level) when control circuit 160 is selected to provide the NMOS control path. Similarly, if transistors T9 and T10 together provide a greater conductivity than transistors T7 and T8, Schmitt trigger circuit 100 will have a smaller lower trip point $V_{T-}$ when PMOS control circuit 170 is selected than when control circuit 175 is selected (again, assuming the same VCC level).

Additionally, if the respective threshold voltages of transistors T12 and T14 in NMOS control circuits 160 and 165 are designed to differ, the two control circuits will also yield different upper trip point voltage levels. In the same manner, if the threshold voltages of transistors T10 and T8 in PMOS control circuits 170 and 175 may have different values, each control circuit will affect the lower trip point voltage level differently.

Figure 5:
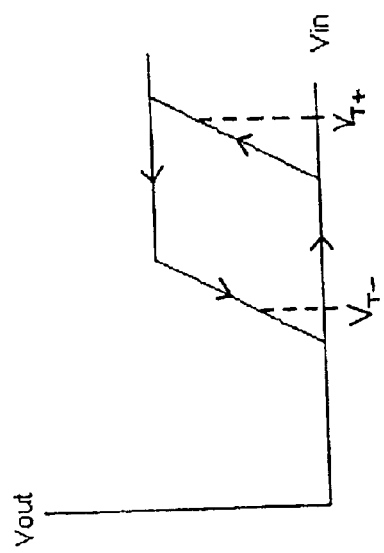
FIG. 5 is a plot illustrating how, for the circuit of FIG. 4, the voltage transfer characteristic may differ at the second power supply signal level by selecting a different set of control circuits.

Thus, by providing two or more sets of switchable control circuits in Schmitt trigger circuit 100, the hysteresis characteristic of the circuit can be adjusted independently of the VCC voltage level. For example, if the VTC illustrated in FIG. 3 corresponds to the selection of one set of control circuits in Schmitt trigger 100 at a given VCC voltage level (in this case VCC=3.3. V), then the VTC characteristic illustrated in FIG. 5 may correspond to the selection of the other set of control circuits in Schmitt trigger 100 for the same VCC level. As a result, a first set of NMOS and PMOS control circuits (e.g., circuits 160 and 170) may be designed to provide desired trip point voltages for a first VCC level, and a second set of NMOS and PMOS control circuits (e.g., circuits 160 and 170) can be designed to provide desired trip point voltages for a second VCC level. In this manner, desired noise margin, delay, and input recognition criteria may be readily met for different VCC voltage levels simply by setting the VCCSEL control signal to the appropriate level. Where circuit 100 is provided in a programmable logic device, VCCSEL may be a programmable signal to facilitate control path selection within the device. Alternatively, a VCC level detection circuit (not shown) may be used to automatically detect the level of the VCC signal and set VCCSEL accordingly.

Furthermore, a Schmitt trigger circuit with more than two switchable sets of control circuits may also be provided. For instance, circuit 100 may be adapted to have four PMOS control circuits each with a corresponding NMOS control circuit. In this case, two VCCSEL control signals (bits) are needed to select one of the four sets of control circuits. Using basic logic circuitry, appropriate control signals may be provided to each control circuit so that the VCCSEL signals select only one NMOS and only one PMOS control circuit in each control mode.

In another embodiment (not shown), PMOS control circuits 170 and 175 may be replaced by a fixed control path PMOS transistor, such as transistor T3 in circuit 10. In this case, only the NMOS control path is switchable and only the upper trip point voltage level can be selectively adjusted. Alternatively, NMOS control circuits 160 and 165 in circuit 100 may be replaced by a fixed control path NMOS transistor, such as transistor T2 in circuit 10, limiting the adjustability of the hysteresis characteristic to the lower trip point voltage level.

Although the Schmitt trigger circuit of the present invention is particularly suitable for use with varying power supply signal levels, different sets of control circuits may also be used to provide variable P/N ratios, even for the same VCC supply. The P/N ratio is the ratio of the PMOS transistor size to NMOS transistor size in the control circuits. Where the gate lengths in the PMOS and NMOS transistors are the same, the P/N ratio equals the ratio of the PMOS gate width to the NMOS gate width.

A P/N ratio of about 2 roughly centers the hysteresis characteristic, since the conductivity of a PMOS transistor is about one-half that of an equivalently sized NMOS transistor. Thus, a set of control circuits with a P/N ratio greater or less than 2 may provide a skewed hysteresis characteristic that favors rising or falling inputs. This may be desirable in high speed applications where one transition direction is more critical than the other.

While the invention has been described in conjunction with specific embodiments, it is evident that numerous alternatives, modifications, and variations will be apparent to those skilled in the art in light of the foregoing description.

What is claimed is:

1. A Schmitt trigger circuit comprising:
   a first transistor coupled between a reference node and a first node, a second transistor coupled between the first node and a second node, a third transistor coupled between the second node and a third node, and a fourth transistor coupled between the third node and a power supply node, each of the first, second, third, and fourth transistors having a control terminal for receiving an input signal;
   a first plurality of circuits for selectively providing a path between the first node and the power supply signal node, each circuit in the first plurality of circuits comprising a fifth transistor and a sixth transistor, the fifth transistor having a control terminal coupled to the second node and the fifth transistor being coupled between the power supply signal node and the sixth transistor, the sixth transistor having a control terminal for receiving a control signal provided to said circuit and the sixth transistor being coupled between the fifth transistor and the first node, wherein each of said circuits is controlled by a control signal so that only one of the first plurality of circuits provides the path between the first node and the power supply signal node at any one time;
   a second plurality of circuits for selectively providing a path between the third node and the reference node, each circuit in the second plurality of circuits comprising a seventh transistor and an eighth transistor, the seventh transistor having a control terminal coupled to the second node and the seventh transistor being coupled between the reference node and the eighth transistor, the eighth transistor having a control terminal for receiving a control signal provided to said circuit and the eighth transistor being coupled between the seventh transistor and the third node, wherein each of said circuits is controlled by a control signal so that only one of the second plurality of circuits provides the path between the third node and the reference node at any one time.

2. The circuit of claim 1 wherein:
   the transistors in each circuit in the first plurality of circuits have a combined conductivity that is different from the combined conductivity of the transistors in any other circuit in the first plurality of circuits; and
   the transistors in each circuit in the second plurality of circuits have a combined conductivity that is different from the combined conductivity of the transistors in any other circuit in the second plurality of circuits.

3. The circuit of claim 1 wherein:
   the first transistor, the second transistor, and the transistors in each circuit in the first plurality of circuits are of a first type; and
   the third transistor, the fourth transistor, and the transistors in each circuit in the second plurality of circuits are of a second type.

4. The circuit of claim 3 wherein the transistors of the first type are n-channel metal oxide semiconductor field-effect transistors, the transistors of the second type are p-channel metal oxide semiconductor field-effect transistors, and the control terminal of each transistor is a gate terminal.

5. The circuit of claim 4 wherein:
   the fifth transistor in each circuit in the first plurality of circuits has a different threshold voltage magnitude from that of the fifth transistor in any other circuit in the first plurality of circuits; and
   the seventh transistor in each circuit in the second plurality of circuits has a different threshold voltage magnitude from that of the seventh transistor in any other circuit in the second plurality of circuits.

6. The circuit of claim 3 wherein
   a source terminal of the first transistor is coupled to the reference node and a drain terminal of the first transistor is coupled to the first node;
   a source terminal of the second transistor is coupled to the first node and a drain terminal of the second transistor is coupled to the second node;
   a drain terminal of the third transistor is coupled to the second node and a source terminal of the third transistor is coupled to the third node;
   a drain terminal of the fourth transistor is coupled to the third node and a source terminal of the fourth transistor is coupled to the power supply signal node;
   in each circuit in the first plurality of circuits, a drain terminal of the fifth transistor is coupled to the power supply signal node, a source terminal of the fifth transistor is coupled to a drain terminal of the sixth transistor, and a source terminal of the sixth transistor is coupled to the first node; and
   in each circuit in the second plurality of circuits, a drain terminal of the seventh transistor is coupled to the reference node, a source terminal of the seventh transistor is coupled to a drain terminal of the eighth transistor, and a source terminal of the eighth transistor is coupled to the third node.

7. The circuit of claim 1 wherein the first and second plurality of circuits each consists of first and second circuits, wherein the first circuits in each plurality of circuits receive a common control signal and the second circuits in each plurality of circuits receive a complementary version of said common control signal.

8. The circuit of claim 1 wherein the control signals provided to each circuit are programmable settings.

9. A Schmitt trigger circuit comprising:
a first transistor coupled between a reference node and a first node, a second transistor coupled between the first node and a second node, a third transistor coupled between the second node and a third node, and a fourth transistor coupled between the third node and a power supply node, each of the first, second, third, and fourth transistors having a control terminal for receiving an input signal;
a plurality of first circuits for selectively providing a path between the first node and the power supply signal node, each first circuit comprising a fifth transistor and a sixth transistor, the fifth transistor having a control terminal coupled to the second node and the fifth transistor being coupled between the power supply signal node and the sixth transistor, the sixth transistor having a control terminal for receiving a control signal provided to said circuit and the sixth transistor being coupled between the fifth transistor and the first node, wherein each of the first circuits is controlled by a control signal so that only one of the first circuits provides the path at any one time; and
a second circuit for providing a path between the third node and the reference node, the second circuit comprising a transistor having a control terminal coupled to the second node and said transistor being coupled between the reference node and the third node.

10. The circuit of claim 9 wherein:
the transistors in each of the plurality of first circuits have a combined conductivity that is different from the combined conductivity of the transistors in any other first circuit.

11. The circuit of claim 9 wherein:
the first transistor, the second transistor, and the transistors in each of the plurality of first circuits are of a first type; and
the third transistor, the fourth transistor, and the transistor in the second circuit are of a second type.

12. The circuit of claim 11 wherein the transistors of the first type are n-channel metal oxide semiconductor field-effect transistors, the transistors of the second type are p-channel metal oxide semiconductor field-effect transistors, and the control terminal of each transistor is a gate terminal.

13. A Schmitt trigger circuit comprising:
a first transistor coupled between a reference node and a first node, a second transistor coupled between the first node and a second node, a third transistor coupled between the second node and a third node, and a fourth transistor coupled between the third node and a power supply node, each of the first, second, third, and fourth transistors having a control terminal for receiving an input signal;
a first circuit for providing a path between the first node and the power supply node, the first circuit comprising a transistor having a control terminal coupled to the second node and the transistor being coupled between the power supply node and the first node; and
a plurality of second circuits for selectively providing a path between the third node and a reference node, each circuit in the plurality of second circuits comprising a fifth transistor and a sixth transistor, the fifth transistor having a control terminal coupled to the second node and the fifth transistor being coupled between the reference node and the sixth transistor, the sixth transistor having a control terminal for receiving a control signal provided to said circuit and the sixth transistor being coupled between the fifth transistor and the third node, wherein each of the second circuits is controlled by a control signal so that only one of the second circuits provides the path between the third node and the reference node at any one time.

14. The circuit of claim 13 wherein:
the transistors in each of the plurality of second circuits have a combined conductivity that is different from the combined conductivity of the transistors in any other second circuit.

15. The circuit of claim 13 wherein:
the first transistor, the second transistor, and the transistor in the first circuit are of a first type; and
the third transistor, the fourth transistor, and the transistors in each of the plurality of second circuits are of a second type.

16. The circuit of claim 15 wherein the transistors of the first type are n-channel metal oxide semiconductor field-effect transistors, the transistors of the second type are p-channel metal oxide semiconductor field-effect transistors, and the control terminal of each transistor is a gate terminal.

17. A Schmitt trigger circuit for receiving an input signal and outputting a signal in accordance with a voltage transfer characteristic having an upper trip point level and a lower trip point level, the circuit comprising a first plurality of independent source follower circuits, each providing a different effect on the upper trip point level when selected, and a second plurality of independent source follower circuits, each providing a different effect on the lower trip point level when selected, and wherein the Schmitt trigger circuit receives one or more control signals for selecting one source follower circuit in the first plurality of source follower circuits and one source follower circuit in the second plurality of source follower circuits so that only one source follower circuit in the first plurality of circuits and only one source follower circuit in the second plurality of circuits is selected at any one time.

18. The circuit of claim 17 wherein the circuits in the first plurality of source follower circuits comprise n-channel metal oxide semiconductor field-effect transistors, and the source follower circuits in the second plurality of circuits comprise p-channel metal oxide semiconductor field-effect transistors.

19. The circuit of claim 18 wherein:
the transistors in each circuit in the first plurality of source follower circuits have a combined conductivity that is different from the combined conductivity of the transistors in any other circuit in the first plurality of source follower circuits; and
the transistors in each circuit in the second plurality of source follower circuits have a combined conductivity that is different from the combined conductivity of the transistors in any other circuit in the second plurality of source follower circuits.

20. The circuit of claim 17 wherein the one or more control signals are programmable settings.

21. A Schmitt trigger circuit for receiving an input signal and outputting a signal in accordance with a voltage transfer characteristic having an upper trip point level and a lower trip point level, the circuit comprising a plurality of independent source follower circuits each providing, when selected, a different effect on one of the upper trip point level and the lower trip point level, and wherein the Schmitt trigger circuit receives one or more control signals for selecting one source follower circuit in the plurality of source follower circuits so that only one source follower circuit is selected at any one time.

22. A method of providing an adjustable hysteresis characteristic in a Schmitt trigger circuit comprising:

providing one or more control signals to the Schmitt trigger circuit; and in response to the one or more control signals, selecting one of a first plurality of independent parallel source follower circuits to provide a first desired signal path in the Schmitt trigger circuit wherein only one source follower circuit is selected at any one time.

23. The method of claim 22 further comprising:

in response to the one or more control signals, selecting one of a second plurality of independent parallel source follower circuits to provide a second desired signal path in the Schmitt trigger circuit.

24. The method of claim 22 comprising providing the one or more control signals based on the voltage level of a power supply signal in the Schmitt trigger circuit.

25. The method of claim 22 comprising programmably providing the one or more control signals.

* * * * *